United States Patent [19]
Weldon et al.

[11] Patent Number: 6,062,959
[45] Date of Patent: May 16, 2000

[54] POLISHING SYSTEM INCLUDING A HYDROSTATIC FLUID BEARING SUPPORT

[75] Inventors: David E. Weldon, Santa Clara; Shu-Hsin Kao, Redwood City; Tim H. Huynh, San Jose, all of Calif.

[73] Assignee: Aplex Group, Sunnyvale, Calif.

[21] Appl. No.: 08/964,773

[22] Filed: Nov. 5, 1997

[51] Int. Cl.[7] .................................................. B24B 21/00
[52] U.S. Cl. ........................ 451/307; 451/303; 451/490
[58] Field of Search ................................... 384/100, 102, 384/103, 106, 125; 451/41, 296, 299, 303, 307, 490

[56] References Cited

U.S. PATENT DOCUMENTS

| | | | |
|---|---|---|---|
| 5,558,568 | 9/1996 | Talieh et al. | 451/303 |
| 5,593,344 | 1/1997 | Weldon et al. | 451/296 |
| 5,722,877 | 3/1998 | Meyer et al. | 451/41 |
| 5,762,536 | 6/1998 | Pant et al. | 451/6 |
| 5,800,248 | 9/1998 | Pant et al. | 451/41 |

*Primary Examiner*—Eileen P. Morgan
*Attorney, Agent, or Firm*—Skjerven, Morrill, MacPherson, Franklin & Friel LLP; David T. Millers

[57] ABSTRACT

A polishing system such as a chemical mechanical belt polisher includes a hydrostatic fluid bearing that supports polishing pads and incorporates one or more of the following novel aspects. One aspect uses compliant surfaces surrounding fluid inlets in an array of inlets to extend areas of elevated support pressure around the inlets. Another aspect modulates or reverses fluid flow in the bearing to reduce deviations in the time averaged support pressure and to induce vibrations in the polishing pads to improve polishing performance. Another aspect provides a hydrostatic bearing with a cavity having a lateral extent greater than that of an object being polished. The depth and bottom contour of cavity can be adjusted to provide nearly uniform support pressure across an area that is surrounded by a retaining ring support. Changing fluid pressure to the retaining ring support adjusts the fluid film thickness of the bearing. Yet another aspect of the invention provides a hydrostatic bearing with spiral or partial cardiod drain grooves. This bearing has a non-uniform support pressure profile but provides a uniform average pressure to a wafer that is rotated relative to the center of the bearing. Another aspect of the invention provides a hydrostatic bearing with constant fluid pressure at inlets but a support pressure profile that is adjustable by changing the relative heights of fluid inlets to alter local fluid film thicknesses in the hydrostatic bearing.

10 Claims, 6 Drawing Sheets

POLISHING SYSTEM INCLUDING A HYDROSTATIC FLUID BEARING SUPPORT

BACKGROUND

1. Field of the Invention

This invention relates to polishing systems and particularly to chemical mechanical polishing systems and methods using hydrostatic fluid bearings to support a polishing pad.

2. Description of Related Art

Chemical mechanical polishing (CMP) in semiconductor processing removes the highest points from the surface of a wafer to polish the surface. CMP operations are performed on unprocessed and partially processed wafers. A typical unprocessed wafer is crystalline silicon or another semiconductor material that is formed into a nearly circular wafer about one to twelve inches in diameter. A typical processed or partially processed wafer when ready for polishing has a top layer of a dielectric material such as glass, silicon dioxide, or silicon nitride or a conductive layer such as copper or tungsten overlying one or more patterned layers that create projecting topological features on the order of about 1 $\mu$m in height on the wafers surface. Polishing smoothes the local features of the surface of the wafer so that ideally the surface is flat or planarized over an area the size of a die formed on the wafer. Currently, polishing is sought that locally planarizes the wafer to a tolerance of about 0.3 $\mu$m over the area of a die about 10 mm by 10 mm in size.

A conventional belt polisher includes a belt carrying polishing pads, a wafer carrier head on which a wafer is mounted, and a support assembly that supports the portion of the belt under the wafer. For CMP, the polishing pads are sprayed with a slurry, and a drive system rotates the belt. The carrier head brings the wafer into contact with the polishing pads so that the polishing pads slide against the surface of the wafer. Chemical action of the slurry and the mechanical action of the polishing pads and particles in the slurry against the surface of the wafer remove material from the surface. U.S. Pat. Ser. No. 5,593,344 and 5,558,568 describe CMP systems using hydrostatic fluid bearings to support a belt. Such hydrostatic fluid bearings have fluid inlets and outlets for fluid flows forming films that support the belt and polishing pads.

To polish a surface to the tolerance required in semiconductor processing, CMP systems generally attempt to apply a polishing pad to a wafer with a pressure that is uniform across the wafer. A difficulty can arise with hydrostatic fluid bearings because the supporting pressure of the fluid in such bearings tends to be higher near the inlets and lower near the outlets. Also, the pressure profile near an inlet falls off in a manner that may not mesh well with edges of the pressure profile an adjacent inlet so that pressure is not uniform even if the elevate pressure areas surrounding two inlets overlap. Accordingly, such fluid bearings can apply a non-uniform pressure when supporting a belt, and the non-uniform pressure may introduce uneven removal of material during polishing. Methods and structures that provide uniform polishing are sought.

SUMMARY

Hydrostatic bearings include or employ one or more of the aspects of the invention to support polishing pads for uniform polishing. In accordance with one aspect of the invention a hydrostatic bearing support in a polishing system provides a fluid flow across fluid pads having compliant surfaces. The support pressure of a fluid film flow from a fluid inlet and across a compliant pad drops more slowly with distance from the fluid inlet than does the support pressure over a rigid pad. Thus, an array of inlets where some or all of the inlets are surrounded by compliant pad can provide a more uniform pressure profile.

In accordance with another aspect of the invention, a fluid flow is varied in a hydrostatic bearing that supports a polishing pad in contact with a wafer or other object being polished. In one case, the fluid flow is periodically reversed by alternately connecting a fluid source to inlets so that fluid flows from the inlets to outlets and then switching the fluid source to the outlets so that fluid flows from the outlets to inlets. Reversing the fluid flow changes the bearing from a configuration in which support pressure is higher over the inlets to a configuration in which support pressure is higher over the outlets. On a time average basis, the support pressure is thus more uniform than if the fluid flow was not reversed. The changes in direction of fluid flow also can introduce vibrations in the polishing pad thereby aiding polishing. Another case of varying the fluid flow introduces pressure variation in the fluid to transmit vibrational energy to the polishing pads. The pressure variation can be introduced, for example, via an electrically controlled valve connected to a fluid source, an acoustic coupling that transfers acoustic energy to the fluid, or a mechanical agitator in the fluid.

In accordance with another aspect of the invention, a hydrostatic bearing includes a large fluid cavity having a lateral size greater than the lateral size of a wafer (or other object) to be polished. The large fluid cavity can provide a large area of uniform support pressure. In one embodiment of the invention, the large fluid cavity is surrounded by a support ring including fluid inlets connected to an independent fluid source. The support ring is outside the area of support for polishing pads in contact with a wafer, but fluid flow from the inlets in the support ring is connected to fluid source having a pressure independent of the pressure in the large fluid cavity. Thus, changing fluid pressure in the support ring can change the fluid film thickness (and support pressure) in the large cavity.

In accordance with yet another aspect of the invention, a hydrostatic bearing has a non-uniform support pressure profile but a wafer (or other object being polished) is moved so that average support pressure is constant across the wafer when averaged over the range of motion. One such hydrostatic bearing includes drain grooves that spiral from an outer region to a central region of the hydrostatic bearing. The spiral drain grooves may follow, for example, a path that is a part of a cardiod. Inlets arranged on concentric circles surrounding the central region have fluid pad areas with boundaries partially defined by the spiral drain grooves. These fluid pads extend along the spiral grooves so that the fluid pads associated with one ring of inlets extend to radii that overlap the radii of the fluid pads for adjacent rings of inlets. The fluid pads are further disposed so that the same percentage of each circumferential path about the center of the bearing is on or over fluid pads. Thus, each point on a wafer that is rotated about the center of the bearing experiences the same average pressure. This hydrostatic bearing can also be used with a support ring of independently controlled fluid inlets outside the outer region of the bearing.

In accordance with another aspect of the invention, a hydrostatic fluid bearing has constant fluid pressure at each fluid inlet and adjusts support pressure by changing the height of one or more inlets and fluid pads with respect to the object being supported. In various embodiments employing this aspect of the invention, a hydrostatic fluid bearing includes a set of inlet blocks where each inlet block includes one or more fluid inlet (and associated fluid pad). The inlet blocks are mounted on a mechanical system that permits adjustments of the relative heights of the inlet blocks. Such mechanical systems can be operated, for example, by air or hydraulic cylinders, piezoelectric transducers, or electrically power actuators or solenoids.

The various aspects of the invention can be employed alone or in combinations and will be better understood in view of the following description and accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
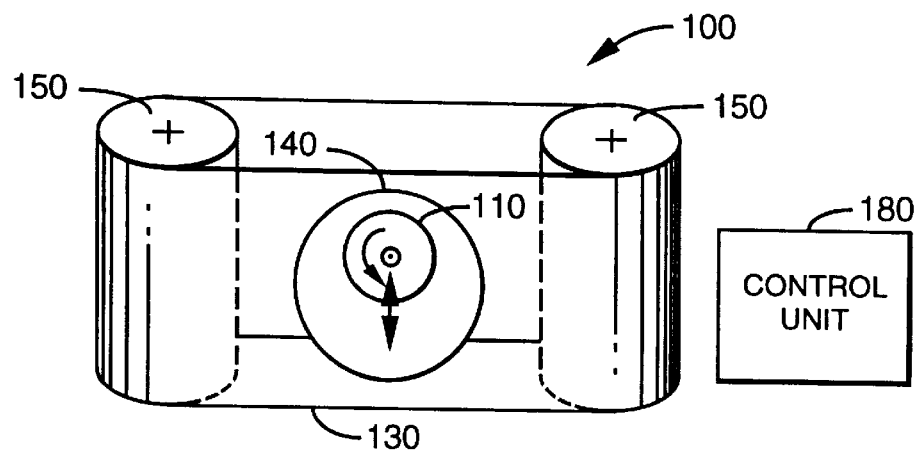
FIG. 1 shows a belt polisher in accordance with an embodiment of the invention.

In accordance with the invention, hydrostatic bearings for supporting polishing pads provide pressure profiles that contribute to uniform polishing. Embodiments of the invention employ a number of inventive aspects that can be used alone or in combinations. In accordance with one aspect of the invention, a hydrostatic bearing uses pads with compliant rather than rigid surfaces. The compliant surface surrounding a fluid inlet changes the pressure profile surrounding the inlet and particularly changes the rate of pressure drop with distance from the inlet. With the changed pressure profiles, broader uniform pressure regions are achieved and overlapping of pressure fields from multiple inlets can provide a more uniform pressure field that would rigid inlets.

In accordance with another aspect of the invention, the fluid flow in a hydrostatic bearing is modulated or periodically reversed to reduce the effects of pressure difference between areas near fluid inlets and areas near fluid outlets. The fluid flow rate and direction can be altered in continuously or switched back and forth from a normal direction to a reversed direction. During normal operation pressure is higher near the inlets and lower near the outlets in a fluid bearing. Reversing the fluid flow causes pressure to be higher near the outlets and lower near the inlets. The periodic changes in pressure can provide a more uniform time-averaged material removal rate across the surface of a wafer being polished. Reversing or modulating the fluid flow can also introduce vibrations in polishing pads that the bearing supports. The vibrations improve the rate and uniformity of polishing.

Yet another aspect of the invention provides fluid bearing configurations that provide uniform polishing. One such hydrostatic bearing includes a fluid inlet to a cavity that is large, e.g., larger than the wafer or other object to be polished. The pressure field across the cavity is nearly constant. Other hydrostatic bearings permit non-uniformity in the support pressure profiles but limit the non-uniformities according to the motion of wafers during polishing. For example, non-uniformities in support pressure are permitted if rotation of the wafer during polishing effectively averages the different polishing rates caused by the pressure differences. Example configurations and shapes of inlets, outlet, and channels for desired non-uniformity in a hydrostatic bearing are described below. In one embodiment, drain grooves defining boundaries of fluid pads follow a spiral or a partial cardioid path. The non-uniform pressure provides uniform polishing when a wafer is rotated about a central axis of the drain grooves.

A further aspect of the invention provides a hydrostatic bearing support that attaches constant pressure sources to fluid inlets but adjusts the support pressure profile by changing film thickness in the hydrostatic bearing. In particular, fluid inlets in the hydrostatic bearing have adjustable heights to vary fluid flim thickness above individual inlets and fluid pads. The change in film thickness changes the support pressure at the polishing pad and allows adjustments of the fluid bearing to improve uniformity of polishing.

Exemplary embodiments of polishing systems in which aspect of this invention can be employed are described in U.S. Pat. No. 5,957,764. entitled "Modular Wafer Polishing Apparatus and Method", which is hereby incorporated by reference herein in its entirety. FIG. 1 illustrates a chemical mechanical polishing (CMP) system 100 which can employ the various aspects of the invention. CMP system 100 includes a wafer carrier head 110, a support assembly 140, and a belt 130 which is between head 110 and support assembly 140. Mounted on belt 130 are polishing pads that are made of an abrasive material such as IC1400™ available from Rodel, Inc. that is divided into areas (or lands) about ½"×½" in size. The width of belt 130 depends on the size of the wafer to be polished; but for an 8-inch wafer, belt 130 is approximately 12 inches in width and about 100 inches around. During polishing, belt 130 and the polishing pads are conditioned with a slurry such as SEMI-SPHERSE 12™ available from Cabot Corporation.

A processed or unprocessed wafer to be polished is mounted on head 110 with the surface to be polished facing the polishing pads on belt 130. Head 110 holds a wafer in contact with the polishing pads during polishing. Ideally, head 110 holds the wafer parallel to the surface of the polishing pads and applies a uniform pressure across the area of the wafer. Exemplary embodiments of wafer carrier heads are described in a co-filed US patent application entitled "Wafer Carrier Head with Attack Angle Control for Chemical Mechanical Polishing", Ser. No. 08/965,033, which is hereby incorporated by reference herein in its entirety. Support 140 and head 110 press polishing pads against the wafer mounted on head 110 with an average pressure between 0 and about 15 psi and a typical polishing pressure of 6 to 7 psi. A drive system 150 moves belt 130 so that the polishing pads slide against the surface of the wafer while head 110 rotates relative to belt 130 and moves back and forth across a portion of the width of belt 130. Support 140 moves back and forth with head 110 so that the centers of support 140 and head 110 remain relatively fixed. Alternatively, support 140 could be fixed relative to system 100 and have a lateral extent that supports belt 130 under the range of motion of head 110. The mechanical action of the polishing pads and particles in the slurry against the surface of the wafer and a chemical action of liquid in the slurry remove material from the wafer's surface during polishing.

The polished wafer becomes uneven if the polishing consistently removes more material from one portion of the wafer than from another portion of the wafer. Different rates of removal can result if the pressure of the polishing pads on the wafer is higher or lower in a particular area. For example, if head 110 applies a greater pressure to a specific area of the wafer being polished or if support 140 applies a greater pressure to a specific area, a higher rate of material removal can result in those areas. The rotational and back and forth motion of head 110 relative to belt 130 averages the variations in material removal rates. However, the differences in material removal can still result in annular variation in the surface topology of the wafer after polishing. Embodiments of the invention provide supports that reduce unevenness in the support pressure and/or reduce the effect that an uneven support pressure has on polishing.

Figure 2:
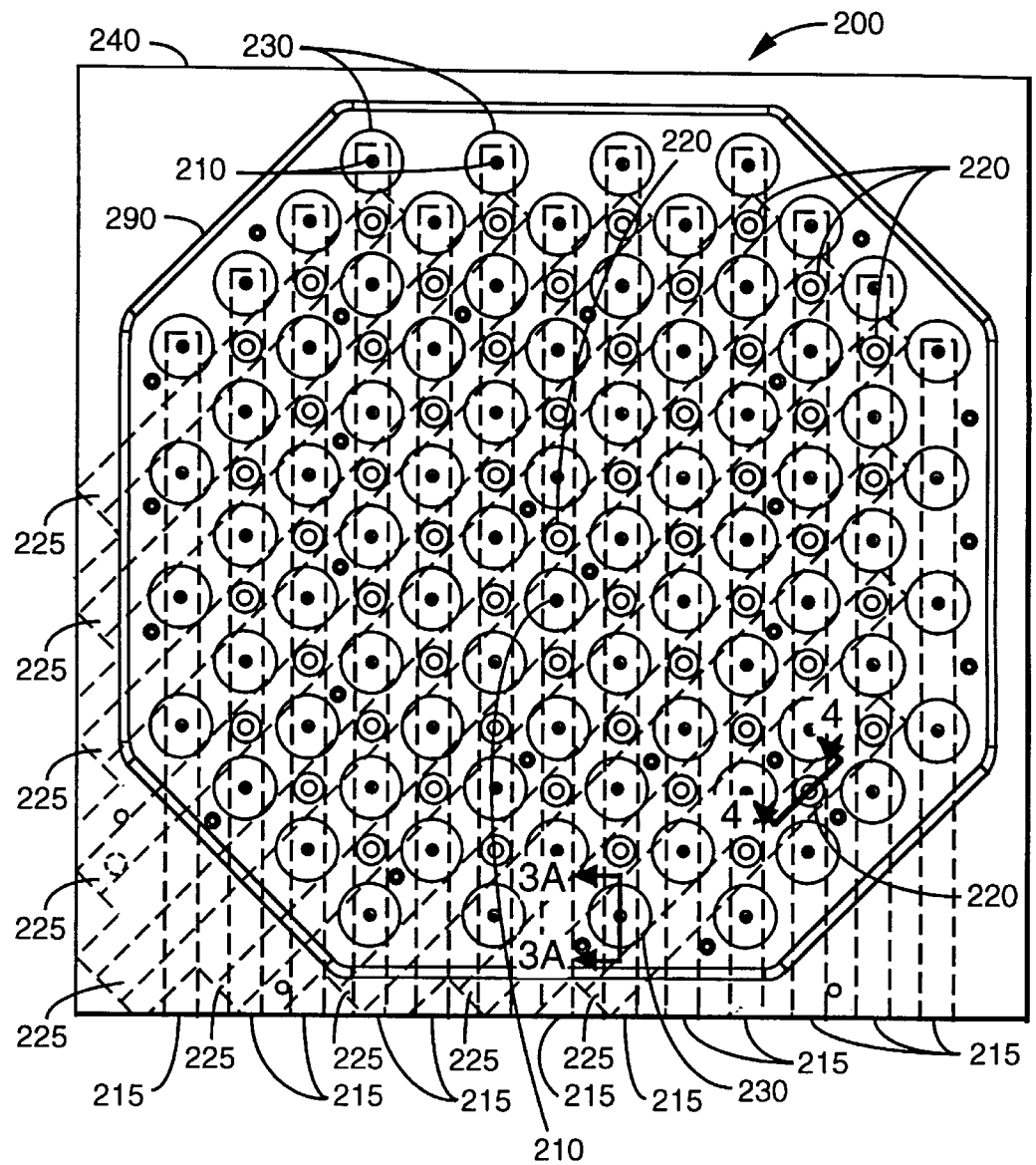
FIG. 2 shows a plan view of a hydrostatic bearing for a belt support in the belt polisher of FIG. 1.

FIG. 2 shows plan view of a hydrostatic bearing 200 that uses compliant pads 230 to form a hydrostatic bearing including an array of inlets 210 with compliant pads 230 in accordance with an embodiment of the invention. Hydrostatic bearing 200 includes a plate 240 on which compliant pads 230 are mounted. Plate 240 is made of a rigid material such as aluminum or any other material of sufficient strength and chemical resistance to withstand the operating environment of a CMP system. Plate 240 is machined or otherwise formed to include inlets 210, outlets 220, and fluid conduits 215 and 225. During normal operation of bearing 200, fluid conduits 215 and 225 respectively connect inlets 210 to one or more fluid sources and outlets 225 to a fluid sink so that fluid from inlets 210 flows across compliant pads 230 and provides the fluid film above compliant pads 230. The fluid film is preferably a liquid such as water and provides a support pressure to support a belt and/or polishing pads. A ridge 290 defines the boundaries of the bearing area and is of sufficient width that a fluid film created by leakage over ridge 290 prevents direct contact between plate 240 and the belt.

Figure 3A:
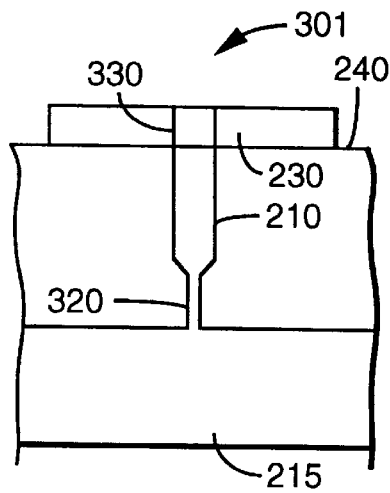
FIGS. 3A, 3B, and 3C respectively show cross-sectional views of inlets with fluid pads having compliant surfaces for use in the fluid bearing of FIG. 2.
Figure 3B:
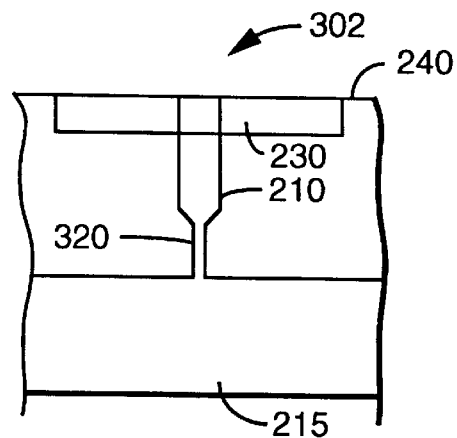
Figure 3C:
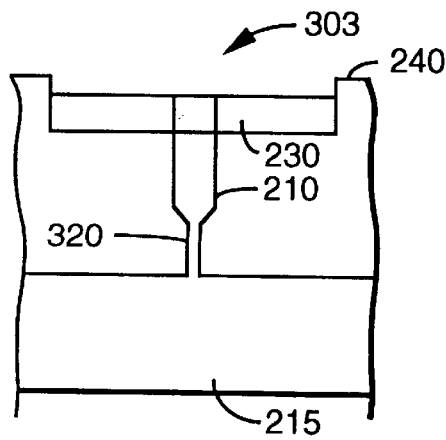

FIGS. 3A, 3B, and 3C show cross-sectional views of compliant hydrostatic bearings 301, 302, and 303 that can be formed at each inlet 210 of FIG. 2. In FIG. 3A, compliant bearing 301 has compliant pad 230 on a top surface of rigid plate 240. Compliant pad 230 is an elastomer material such as rubber or neoprene. For operation of bearing 200, a fluid such as water at a pressure selected according to the leakage from bearing 200 and the load that bearing 200 carries passes from inlet 210 through a hole 330 in the center of compliant pad 230. An inlet pressure between 0 and 15 psi is typical when supporting a polishing pad during polishing. Pad 230 is sized according to the density of inlets in bearing 200 and in an exemplary embodiment are about 0.75" in diameter for an array of inlets separate by about 1.125". In this exemplary embodiment, the hole in pad 230 and inlet 210 at its widest is between 0.020" and 0.0625" in diameter. Inlet 210 also includes orifice or restriction 320 that restricts bearing stiffness, fluid flow rates, and other attributes of bearing 200.

Figure 5:
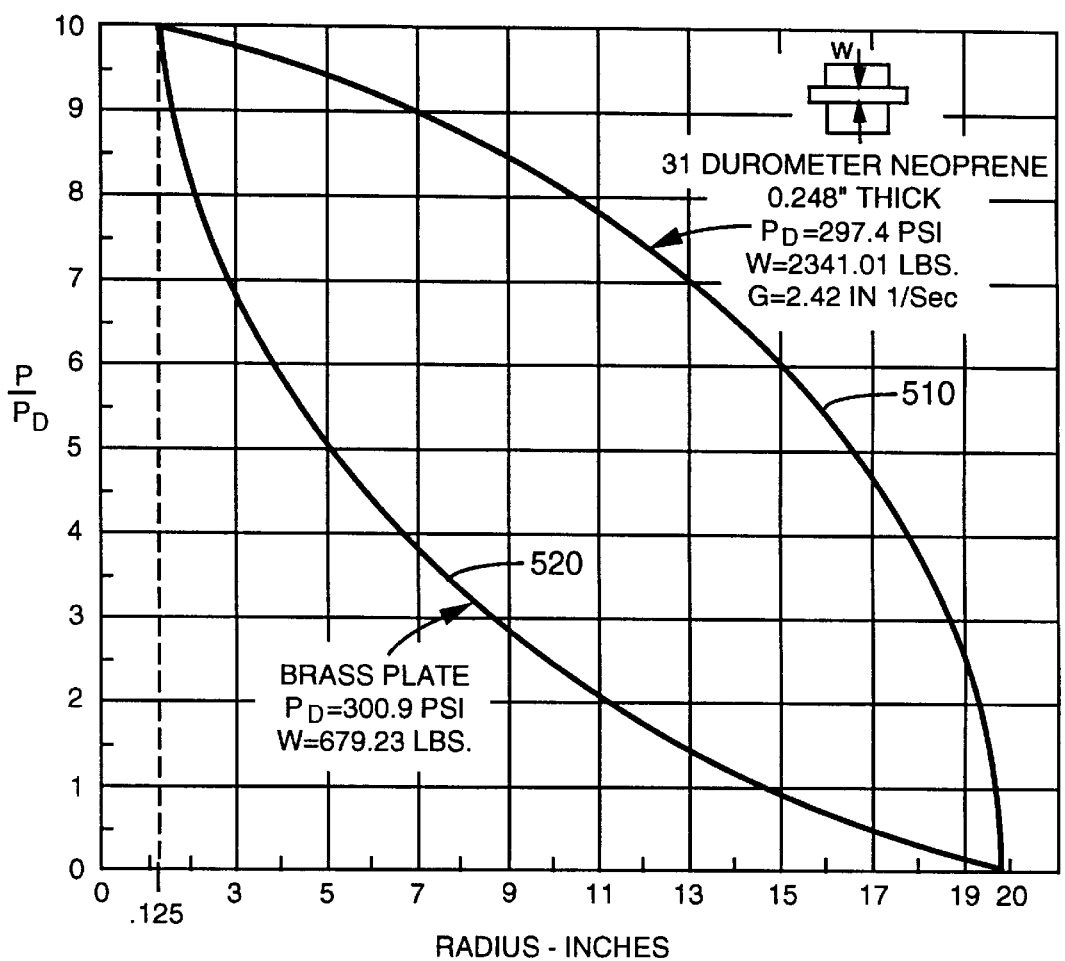
FIG. 5 shows plots of support pressure verses distance from the center of an inlet when the surrounding pad has a compliant surface or a rigid surface.

Compliant bearing 301 provides a broader area of elevated support pressure than do hydrostatic bearings having rigid surfaces. FIG. 5 shows respective plots 510 and 520 of normalized pressure versus radius for a compliant bearing such as bearing 301 and a non-compliant hydrostatic bearing having rigid surfaces. When a weight is supported by either type of hydrostatic bearings, the support pressure is at its maximum pressure P over the fluid inlet, but outside the radius of the fluid inlet pressure drops. Plot 510 shows that pressure initially falls off much more slowly for a compliant bearing than for a non-compliant bearing. For example, at a radius about four times the radius of the inlet, the support pressure from the compliant bearing is about four times the support pressure of the non-compliant bearing. The wider area of significantly elevated pressure in a compliant bearing is believed to be caused by deformation of compliant pad 210 changing the fluid film thickness. Where pressure is highest, pad 210 is compressed which increases film thickness. Where pressure is lower, pad 210 expands to decrease film thickness and maintain pressure at a higher level than would a rigid surface. A wider area of significantly elevated pressure for a compliant bearing reduces the size of low pressure areas between inlets 210 in an array such as in bearing 200 of FIG. 2. Thus, the support pressure profile of bearing 200 is more nearly constant. Additionally, individual inlets 210 can be placed close enough together in an array that elevated pressure areas overlap if drains 220 are less than 100% efficient at reducing pressure between inlets.

Compliant bearing 302 of FIG. 3B has compliant pad 210 counter sunk into plate 240 so that in a relaxed state, a top surface of compliant pad 210 is flush with the top surface of plate 240. Compliant bearing 303 of FIG. 3C has compliant pad 210 further counter sunk into plate 240 so that in a relaxed state, a top surface of compliant pad 210 is below the top surface of plate. Bearings 302 and 303 have pressure profiles that include features from both compliant and non-compliant hydrostatic bearings. The counter sinking of compliant pads 210 changes the stiffness of the fluid bearing. Accordingly, the amount of counter sinking can be selected according to the desired stiffness for the bearing. Alternatively, a mounting that permits movement of the pad 230 to change the depth of the fluid pocket over pad 230 to provide bearing 200 with adjustable stiffness.

Figure 4:
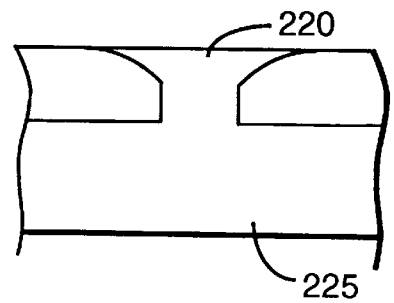
FIG. 4 shows a cross-sectional view of an outlet for the fluid bearing of FIG. 2.

FIG. 4 shows a cross-sectional view of an embodiment of one of outlets 220 of FIG. 2. Each outlet 220 is connected to one of conduits 225 which are formed in plate 240 above or below conduits 215. During normal operation, conduits 225 are connected to a fluid drain or sink.

In accordance with an aspect of the invention, fluid flow between inlets 210 and outlets 220 is modulated by varying the fluid flow, e.g., varying the pressure, flow rate, or the direction of fluid flow. For example, a fluid source and a fluid sink can be periodically switched between a normal configuration where the fluid source is connected to conduits 215 and inlets 210 and the fluid sink is connected to conduits 225 and outlets 220 and a reversed configuration where the fluid sink is connected to conduits 215 and inlets 210 and the fluid source is connected to conduits 225 and outlets 220. In the normal configuration, fluid films around inlets 210 provide the highest pressure to support belt 130, and lower pressures are near fluid outlets 220. Accordingly, the polishing pad areas that are above inlets 210 tend to remove wafer material faster than polishing pad areas over outlets 220, which can result in uneven polishing. In the reverse configuration, highest support pressure regions form near outlets 220. Thus, in the reverse configuration, the polishing pad areas that are above outlets 220 tend to remove wafer material faster than polishing pad areas over inlets 210. Periodically, switching between normal and reverse configurations tends to average the removal rates for all polishing pad areas. Such switching can be for all inlets 210 and outlets 220 simultaneously or sequentially in some pattern.

The array of inlets 210 and outlets 220 in bearing 200 is asymmetric in that inlets 210 differ in sizes, number, and distribution from outlets 220. A more symmetric fluid bearing having outlets of the same or similar size, number, and distribution as inlets may improve the smoothing effects caused by periodically reversing the fluid flow. However, smoothing of the average pressure profile by periodically switching the direction of fluid flow can be applied to any hydrostatic bearing and is not limit to a symmetric bearing configuration or to the configuration of bearing 200.

Figure 8:
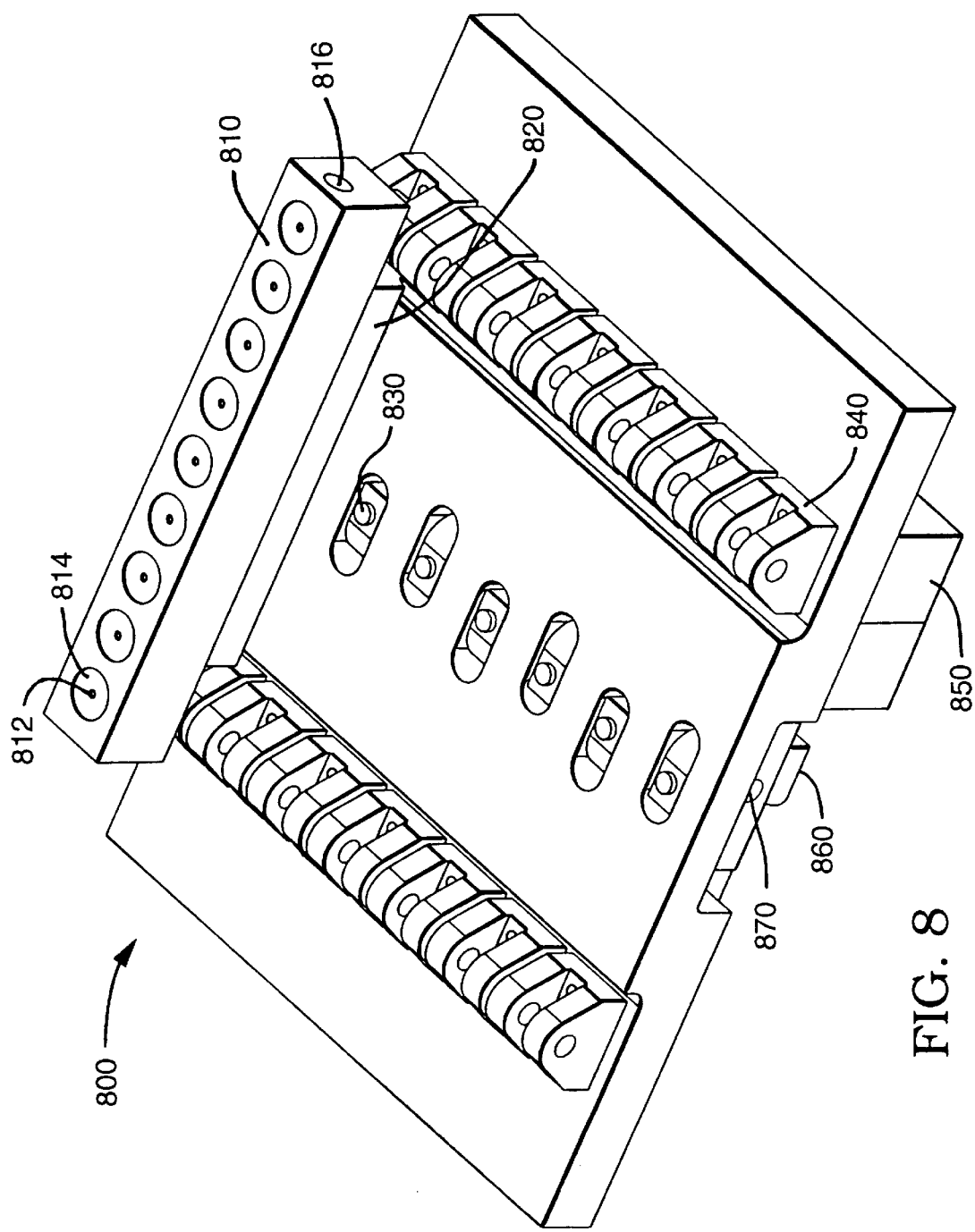
FIG. 8 shows a perspective view of a hydrostatic bearing having inlets with adjustable relative heights for adjusting local fluid film thicknesses and support pressures.

Another effect from periodically reversing the direction of fluid flow is that the changing pressures in support 140 or bearing 200 introduces oscillations or vibrations in belt 130 and the polishing pads. Depending on vibration of polishing pads alone can provide superior polishing but at low polishing removal rates. The combined effects of belt rotation and vibrations are believed to improve polishing performance over belt rotation alone. Vibrations can be introduced in belt 130 by reversing fluid flow or by alternative methods such as modulation of fluid flow. For example, fluid flow rates or pressure can be changed smoothly, for example, sinusoidally between the normal configuration to the reversed configuration. Modulating the fluid flow without reversing the direction of fluid flow can also introduce vibrations and can be achieved in a number of ways. For example, an electric signal having the desired frequency can operate an electromechanical pressure controller (e.g., a solenoid valve) to modulate the pressure or flow rate at the desired vibrational frequency. Alternatively, an acoustic coupler or a mechanical agitator in the fluid can introduce acoustical energy or mechanical vibratory energy that is transmitted through the fluid to belt 130 and the polishing pads. Such modulation or vibrational energy transfers can be uniform for all inlets 210 or individually controlled for single inlets or groups of inlets. Yet another alternative for causing vibration in the polishing pads is to vibrate support 140 to alter film thickness in the hydrostatic bearing. Embodiments of the invention described below in regard to FIG. 8 provide control of the film thickness for individual or groups of inlets for better control of vibrations introduced.

Figure 6:
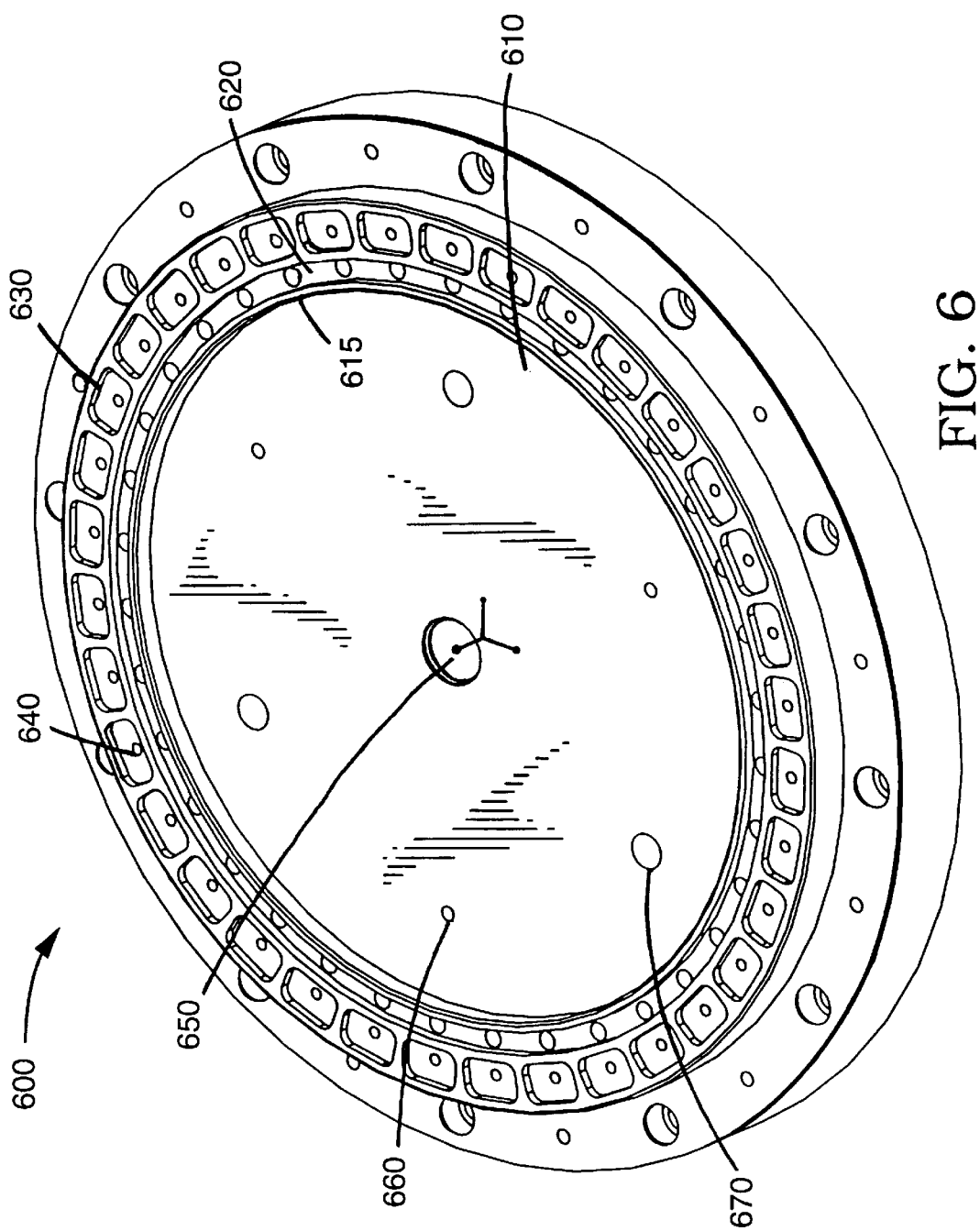
FIG. 6 shows a perspective view of a hydrostatic bearing having a large fluid cavity that covers a supported polishing area.

In accordance with another embodiment of the invention, FIG. 6 shows a hydrostatic fluid bearing 600 having a cavity 610 with a diameter larger than that of the wafer to be polished. In particular, fluid in cavity 610 supports the entire area of belt 130 where the wafer can contact polishing pads. In the embodiment shown, bearing 600 is circular to match the shape of a wafer and moves during polishing to follow the motion of wafer. Alternatively, bearing 600 and cavity 610 can be elongated to support the polishing pads covering the entire range of motion of a wafer during polishing. Cavity 610 is surrounded by an elevated ridge or lip 615 that separates cavity 610 from a drain ring 620. A fluid inlet 650 at the center of cavity 610 fills cavity 610 with fluid that overflows ridge 615 and drains out of bearing 600 through drain ring 620.

A retaining ring support 630 formed from fluid bearings associated with inlets 640 surrounds drain ring 620 and supports belt 130 around but outside the area where the wafer contacts polishing pads during polishing. Bearing 600, thus, supports belt 130 entirely on fluid to provide nearly frictionless and non-wearing bearing. A head on which the wafer is mounted may include a retaining ring that contacts the pads overlying retaining ring support 630. The pressure to inlets 640 is controlled separately from the pressure to inlet 650 of cavity 610 and can be adjusted for the pressure provided by the retaining ring on the wafer head. The pressure to retaining ring support 630 can also be used to adjust the fluid film thickness and fluid depth in cavity 610. Fluid from retaining ring support 630 drains outward from bearing 600 to purge contaminants such as slurry or residue from a polishing process away from cavity 610.

Large cavity 610 has the advantage of providing a nearly uniform pressure for wafer support without regard for induced flow effects that motion of belt 130 causes. Induced flow effects can be changed by shaping cavity 610. In particular, the depth of cavity 610 can be adjusted, the shape of cavity 610 can be changed (e.g., the bottom of cavity 610 can be flat or contoured), and additional inlets (or even outlets) can be introduced to cavity 610 to provide a favorable pressure distribution. In the embodiment shown in FIG. 6, a bottom plate of cavity 610 is mounted with adjustment screws that permit adjustment of the depth of cavity 610, and sensors 670 in cavity 610. Sensors 670 can be distance sensors to measure the distance to belt 130 (or equivalently the film thickness) or pressure sensors to monitor the pressure distribution. Control unit 180 uses the sensor measurements for possible system adjustment such as changing cavity depth or the fluid pressure to inlet 650. Deeper pockets tend to handle induced flow effects more efficiently, where shallower pockets are more affected by motion of the belt. A suitable depth is typically about ½".

As an alternative to attempting to provide uniform pressure, a non-uniform pressure distribution is acceptable if motion of a wafer averages the effects of the non-uniform pressure. For example, the pressure is non-uniform in a hydrostatic bearing including uniform pressure pads if drain groves in the support area provide a lower support pressure. However, if each point on a wafer is over a pressure pad for the same percentage of polishing time, the average applied pressure is constant for all points on the wafer, and the sum or average of polishing due to the non-uniform distribution of pressure results in uniform polishing.

Figure 7:
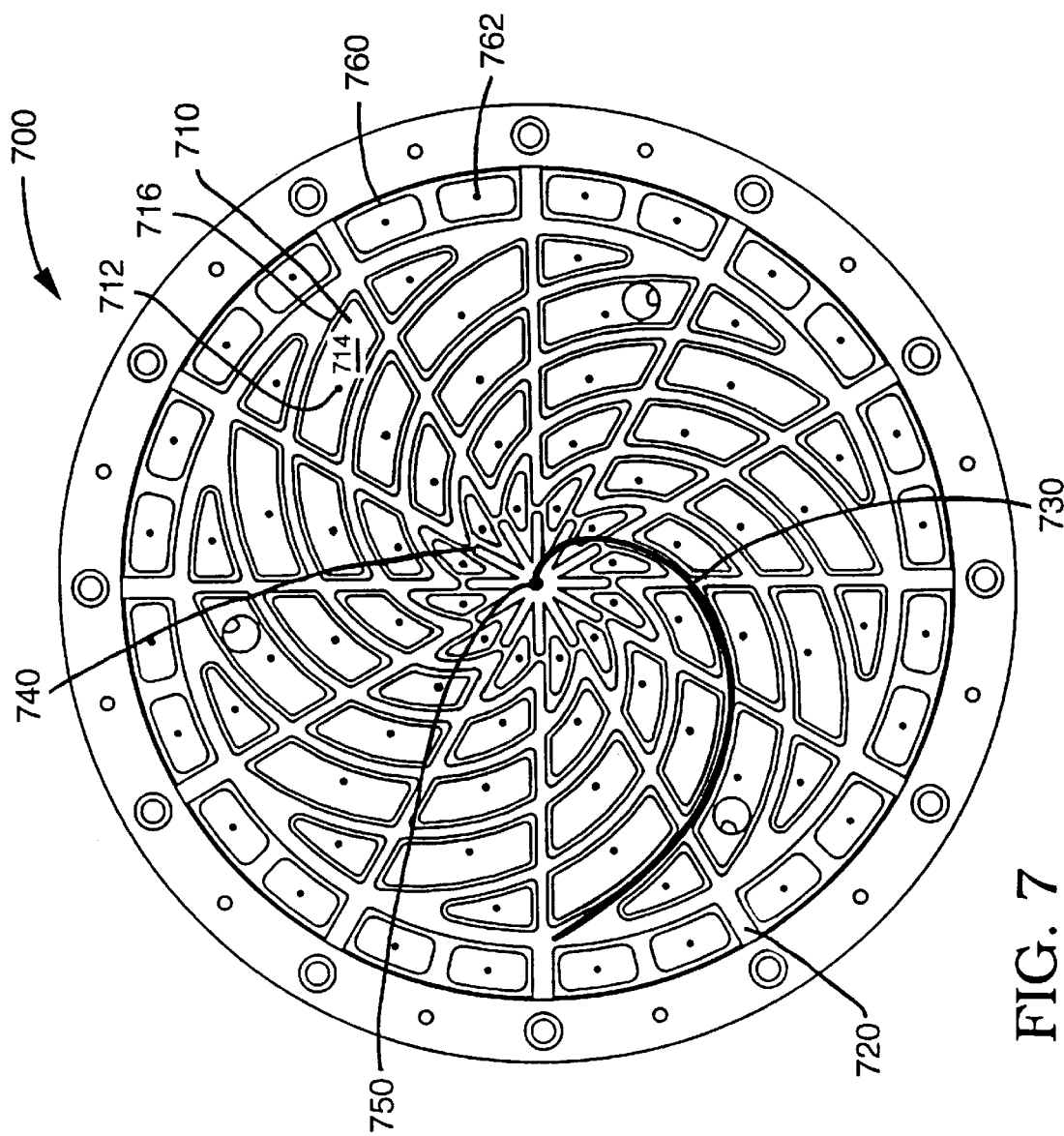
FIG. 7 shows a perspective view of a hydrostatic bearing having spiral or cardiod fluid drain grooves.

FIG. 7 shows a plan view of a hydrostatic bearing 700 that has a non-uniform pressure distribution but provides uniform average pressure to a wafer when the wafer rotates relative to a center axis 750 of bearing 700. Bearing 700 includes pressure pads 710, radial drain grooves 720, and cardiod drain grooves 730. Drain grooves 720 and 730, which connect to a fluid sink, define the boundaries of pressure pads 710. In particular, each cardiod drain groove 730 follows the trace of a part (about half) of a cardioid so that some of the sides of pads 710 are also sections of cardioids. More generally grooves 730 are not required to follow a partial cardiod path but alternatively follow a path that spirals between an outer region and a central region of bearing 700. A star shaped pressure pad 740 is in a region at the center 750 of bearing 700 where grooves 720 and 730 (if extended) would intersect with insufficient space between the grooves for fluid pads. Each fluid pad 710 includes a fluid inlet 712, a cavity 714, and a landing 716. Fluid inlets 712 are located on concentric circles, and each fluid inlet 712 is in an associated cavity 714 that is bounded by an associated landing 716. Alternatively, multiple inlets could be provided in each cavity 712. During normal CMP operations, a fluid flow from inlets 712 across landings 714 to drain grooves 720 and 730 maintains a nearly constant pressure to a portion of belt 130 supported by the fluid film above pads 710. Pressure to the portion of the belt over drain grooves 720 and 730 is lower than the pressure over pads 710. Bearing 700 also includes inlets 762 and pressure pads 760 that form a retaining ring support outside the area under a wafer during polishing. Pads 760 provide additional support for belt 130 to maintain desired film thickness in bearing 700. Fluid pressure to pads 710, 740, and 760 can be separately controlled.

In accordance with an aspect of the invention, rotation of a wafer about center 750 causes each point on the wafer (not above center pad 740) to cross pressure pads 710, radial drain grooves 720, and cardiod drain grooves 730. Ideally, during a revolution, the percentage of time that any point on the wafer spends over pads 710 is the same as the percentage of time that every other point on the wafers spends over pads 710. To achieve this goal, the total angular extent of pads 710 should be the same for any circle centered about axis 750. Using cardiod or spiral grooves 730 helps achieve this goal. In particular, each pad 710 can be classified by the circle intersecting the inlet 712 for the pad, and pads 710 having inlets 712 on a circle of inlets extend radially (or along cardiod grooves 730) to overlap the radial extent of pads 710 with inlets 712 on a smaller circle and pads 710 with inlets 712 on a larger circle. Each circular path for a point on a wafer crosses pads 710 and cannot be entirely within a groove. Second, cardiod grooves 730 become closer to tangential with increasing distance from center axis 750, and a circumferential crossing distance of a cardiod groove 730 becomes longer with increasing radius. Thus, the effective groove width increases to match increases in pad size, keeping the angular extent of pads 710 roughly constant. Center pad 740 has a separate inlet pressure control that can be adjusted so that pad 740 provides about the same average pressure over a circle as do pads 710.

In accordance with another aspect of the invention, a hydrostatic support bearing uses a constant fluid pressure from a fluid source and at fluid inlets but changes the local fluid film thickness to adjust the support pressure profile of the hydrostatic support. In one embodiment of the invention, a mechanical system changes the fluid film thickness by changing the relative heights of pads surrounding fluid inlets. While the inlet fluid pressure is constant, the support pressure can be increased in the area of a pad by moving the pad toward the belt to decrease the fluid film thickness above the pad. In a typical hydrostatic bearing with an average fluid film thickness of about 0.001 inches, height adjustments on the order of 0.0001 or 0.0002 inches give a range of support pressure suitable for adjustment of a polishing system.

FIG. 8 shows a perspective drawing of a portion of a hydrostatic bearing 800 employing a movable inlet block 810 that contains inlets 812, pads 814, and a fluid conduit 816 that connects inlets 812 to a constant pressure fluid source during operation of bearing 800. The full fluid bearing 800 contains six inlet blocks 810, and an associated deflection beam 820 supports each block 810. FIG. 8 shows only one inlet block—deflection beam pair to better illustrate structures underlying deflection beams 820. Spaces between inlet blocks 810 form fluid drains.

Each deflection beam 820 rests on contact point 830 and is mounted in a clevis mount 840. Contact points 830 apply upward forces to deflect associated deflection beams 820 and move associated inlet blocks 810. The amount of deflection of (or equivalently the amount of force applied to) each defection beam 820 determines the height of pads 814 and the overlying fluid film thickness during operation of bearing 800. Independent control of contact points 830 provides independent control of the heights of blocks 810. Each contact point 830 is on an associated lever arm 860 having a pivot point 870. Independent actuators 850 connect to lever arms 860 and apply torques to the associated lever arms 860 to control the forces on deflection beams 220. Many alternative systems for changing the height of an inlet block may be employed. For example, hydraulic or air cylinder or a piezoelectric actuator can be directly attached to move deflector beam 820 and/or inlet block 810.

During operation of fluid bearing 800, each conduit 816 is connected to a constant pressure fluid source so that the pressure of fluid exiting inlets 812 is nearly constant. The exiting fluid from inlets 814 forms fluid films in the areas of pads 814 and between blocks 810 and the belt or other surface supported by bearing 800. With constant inlet pressure and pad area, the support pressure depends on film thickness. A user of a polishing system can manipulate actuators 850 to change height of pads 814 and therefore change the film thickness in the neighborhood of specific pads and the support pressure in that neighborhood. Changing the support pressure can correct uneven polishing for example, by increasing or decreasing the support pressure in areas have too low or too high of a rate material removal.

In bearing 800, each inlet block 810 contains a linear array of inlets 812 and pads 814. Fluid bearing 200 of FIG. 2 contains such linear arrays, and a set of inlet blocks 810 can form the inlet pattern of bearing 200. Pads 814 can have either compliant (as in bearing 200) or rigid surfaces. Alternatively, any shape inlet block with any desired pattern of inlets and pads can be mounted on a mechanical system that raises or lowers the block. In particular, a bearing can include inlet blocks that are concentric rings where each inlet block has independently adjustable height and a ring of inlets formed in the block. The pads surrounding the such inlets can have any desired shape including, for example, the shapes of pads 710 in fluid bearing 700 of FIG. 7. A retaining ring support including pads 760 and inlets 762 can have adjustable height (or fluid film thickness) or an independent fluid pressure from the remainder of the pads. In yet another alternative embodiment, each pad in a hydrostatic fluid bearing has an independently controlled height to allow user variation of film thickness for each pad individually.

Although the invention has been described with reference to particular embodiments, the description is only an example of the invention's application and should not be taken as a limitation. For example, although the specific embodiments described are CMP belt polishing systems for polishing semiconductor wafers, other embodiments include other types of polishing systems that may be used for other purposes. For example, the hydrostatic bearings and supports described herein can be employed in a mechanical polishing system having polishing pads on a rotating disk or belt for polishing semiconductor wafers or optical or magnetic disks for use in CD ROM drives and hard drives. Various other uses, adaptations, and combinations of features of the embodiments disclosed are within the scope of the invention as defined by the following claims.

What is claimed is:

1. A support for a polishing tool, including a hydrostatic fluid bearing that comprises:
    a plate defining a depression having an area greater than that of an object to be polished, the depression being surrounded by a ridge in the plate;
    an inlet leading to the depression, for connection to a fluid source; and
    an outlet for connection to a fluid sink, the outlet being in an area surrounding the ridge.

2. The support of claim 1, wherein the outlet and inlet are formed in the plate.

3. The support of claim 1, further comprising a support ring surrounding the depression, wherein the outlet is between the ridge and the support ring.

4. The support of claim 3, wherein the support ring comprises a plurality of pads, each pad having an inlet for fluid flowing across the pad.

5. The support of claim 3, wherein the depression has an adjustable bottom plate which can be moved to change a depth of the depression.

6. The support of claim 1, wherein the depression is elongate along a direction of motion of the object during polishing.

7. The support of claim 5, wherein the bottom plate is mounted with adjustment screws that permit adjustment of the depth of the depression.

8. The support of claim 4, wherein fluid pressure to the inlet leading into the depression is controlled separately from fluid pressure to the inlets of the pads.

9. The support of claim 1, wherein a flat bottom surface covers the area of the depression.

10. The support of claim 1, wherein a contoured bottom surface covers the area of the depression.

\* \* \* \* \*